(12) United States Patent
Son et al.

(10) Patent No.: US 8,792,239 B2
(45) Date of Patent: Jul. 29, 2014

(54) POWER MODULE PACKAGE AND METHOD FOR MANUFACTURING THE SAME

(75) Inventors: Jin Suk Son, Gyunggi-do (KR); Kwang Soo Kim, Gyunggi-do (KR); Young Ki Lee, Gyunggi-do (KR); Sun Woo Yun, Gyunggi-do (KR); Sung Keun Park, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 218 days.

(21) Appl. No.: 13/280,866

(22) Filed: Oct. 25, 2011

(65) Prior Publication Data

US 2013/0010425 A1 Jan. 10, 2013

(30) Foreign Application Priority Data

Jul. 8, 2011 (KR) .................. 10-2011-0068003

(51) Int. Cl.
*H05K 7/20* (2006.01)
(52) U.S. Cl.
USPC ........... 361/689; 361/699; 165/80.4; 257/714
(58) Field of Classification Search
None
See application file for complete search history.

(56) References Cited

U.S. PATENT DOCUMENTS

| | | | | |
|---|---|---|---|---|
| 5,763,951 A * | 6/1998 | Hamilton et al. | ............. | 257/714 |
| 5,915,463 A * | 6/1999 | Romero et al. | ............. | 165/80.3 |
| 6,164,368 A * | 12/2000 | Furukawa et al. | ........ | 165/104.33 |
| 6,265,767 B1 * | 7/2001 | Gaku et al. | ................... | 257/678 |
| 6,310,775 B1 * | 10/2001 | Nagatomo et al. | ............ | 361/707 |
| 6,411,512 B1 * | 6/2002 | Mankaruse et al. | .......... | 361/700 |
| 6,600,651 B1 * | 7/2003 | Weng | ............... | 361/700 |
| 6,809,424 B2 * | 10/2004 | Pike et al. | ...................... | 257/782 |
| 6,912,130 B2 * | 6/2005 | Osanai et al. | ................. | 361/699 |
| 6,992,888 B1 * | 1/2006 | Iyer | ................. | 361/699 |
| 7,215,547 B2 * | 5/2007 | Chang et al. | .................. | 361/701 |
| 7,353,859 B2 * | 4/2008 | Stevanovic et al. | .......... | 165/80.4 |
| 7,364,684 B2 * | 4/2008 | Brandenburg et al. | .. | 264/272.13 |
| 7,888,786 B2 * | 2/2011 | Andry et al. | ................... | 257/690 |
| 7,940,526 B2 * | 5/2011 | Schulz-Harder et al. | ..... | 361/699 |
| 8,058,722 B2 * | 11/2011 | Gao et al. | ...................... | 257/698 |

(Continued)

FOREIGN PATENT DOCUMENTS

| | | |
|---|---|---|
| JP | 62-142021 | 6/1987 |
| JP | 06-151657 | 5/1994 |

(Continued)

OTHER PUBLICATIONS

Office Action from counterpart Korean Patent Application No. 10-2011-0068003, mailed Sep. 11, 2012, 6 pages, English Summary included.

(Continued)

*Primary Examiner* — Boris Chervinsky
(74) *Attorney, Agent, or Firm* — Bracewell & Giuliani LLP; Brad Y. Chin

(57) ABSTRACT

Disclosed herein are a power module package and a method for manufacturing the same. The power module package includes: a base substrate made of a metal material; cooling channels formed to allow a cooling material to flow in an inner portion of the base substrate; an anodized layer formed on an outer surface of the base substrate; a metal layer formed on a first surface of the base substrate having the anodized layer and including circuits and connection pads; and semiconductor devices mounted on the metal layer.

6 Claims, 10 Drawing Sheets

(56) References Cited

U.S. PATENT DOCUMENTS

| | | | |
|---|---|---|---|
| 8,391,011 B2* | 3/2013 | Mori et al. | 361/717 |
| 8,659,898 B2* | 2/2014 | Brunschwiler et al. | 361/699 |
| 2007/0252268 A1* | 11/2007 | Chew et al. | 257/714 |
| 2008/0084665 A1* | 4/2008 | Tigwell | 361/699 |

FOREIGN PATENT DOCUMENTS

| | | |
|---|---|---|
| JP | 09-283679 | 10/1997 |
| JP | 2004-080856 | 3/2004 |
| JP | 2008-147208 | 6/2008 |
| JP | 2008-263137 | 10/2008 |
| KR | 1020100126909 A | 12/2010 |
| KR | 1020110008634 A | 1/2011 |

OTHER PUBLICATIONS

Office Action from counterpart Japanese Patent Application No. 2011-228704, mailed May 14, 2013, 4 pages, English Summary included.

* cited by examiner

POWER MODULE PACKAGE AND METHOD FOR MANUFACTURING THE SAME

CROSS REFERENCE TO RELATED APPLICATION

This application claims the benefit of Korean Patent Application No. 10-2011-0068003, filed on Jul. 8, 2011, entitled "Power Module Package and Method for Manufacturing the Same", which is hereby incorporated by reference in its entirety into this application.

BACKGROUND OF THE INVENTION

1. Technical Field

The present invention relates to a power module package and a method for manufacturing the same.

2. Description of the Related Art

In accordance with a global increase in energy usage, the interest in efficient use of limited energy has been significantly increased. Therefore, the adoption of an inverter using an intelligent power module (IPM) for efficiently converting energy in existing home appliances and industrial products has accelerated.

In accordance with an increase in use of this power module, the market's demand for a power module having high integration density, high capacity, and a small size has increased. Therefore, interest in the necessity of solving a heat generation problem of an electronic component has significantly increased.

Therefore, in order to increase efficiency of the power module and secure high reliability thereof, as a scheme for solving the heat generation problem, a structure in which the power module and a water cooling system are separately manufactured and then combined with each other has been used.

However, in the case of the above-mentioned structure, a manufacturing cost for each of the power module and the water cooling system increases, and it is difficult to expect effective heat radiation effect due to a form in which separate apparatuses are combined with each other.

SUMMARY OF THE INVENTION

The present invention has been made in an effort to provide a power module package for improving heat radiation efficiency by forming a power module and a heat sink allowing a cooling material to flow integrally with each other, and a method for manufacturing the same.

According to a first preferred embodiment of the present invention, there is provided a power module package including: a base substrate made of a metal material; cooling channels formed to allow a cooling material to flow in an inner portion of the base substrate; an anodized layer formed on an outer surface of the base substrate; a metal layer formed on a first surface of the base substrate having the anodized layer and including circuits and connection pads; and semiconductor devices mounted on the metal layer.

The cooling channel may be formed at the center of the base substrate in a thickness direction thereof.

The cooling channel may have a circular or polygonal cross section shape in a thickness direction of the base substrate.

The cooling channel may include: an introduction part having the cooling material introduced therethrough; a path part connected to the introduction part to thereby allow the introduced cooling material to pass therethrough; and a discharge part connected to the path part to thereby allow the cooling material to be discharged therethrough, and, when the path part includes a plurality of paths, the plurality of paths may have a symmetrically radial shape based on the introduction part and the discharge part.

The cooling channel may include: an introduction part having the cooling material introduced therethrough; a path part connected to the introduction part to thereby allow the introduced cooling material to pass therethrough; and a discharge part connected to the path part to thereby allow the cooling material to be discharged therethrough, and a width of the path part may be larger than those of the introduction part and the discharge part in a direction in which the cooling material passes.

The cooling channel may have a pipe shape having a plurality of bendings.

The cooling channel may include: an introduction part having the cooling material introduced therethrough; a path part connected to the introduction part to thereby allow the introduced cooling material to pass therethrough; and a discharge part connected to the path part to thereby allow the cooling material to be discharged therethrough, and when the path part includes a plurality of paths, the plurality of paths may be formed to be in proportion to a heat generation amount of the semiconductor devices, and the plurality of formed paths may be disposed under areas in which the semiconductor devices are mounted.

The power module package may further include lead frames formed on the metal layer; and wires for electrical connection between the semiconductor devices and between the semiconductor device and the lead frame.

The power module package may further include a molding formed to enclose an upper portion of the base substrate and sides thereof.

The base substrate may be made of aluminum.

According to a second preferred embodiment of the present invention, there is provided a method for manufacturing a power module package, the method including: preparing first and second plates made of a metal material; forming an anodized layer on surfaces except for one surfaces of the first and second plates; forming groove-shaped cooling channels inwardly from one surface of both or one of the first and second plates; forming a metal layer including circuits and connection pads on the anodized layer on the other surface of the first plate; mounting semiconductor devices on the metal layer; and bonding the first and second plates to each other.

In the forming of the cooling channels, the cooling channel may be formed so that it is positioned at the center of the base substrate in a thickness direction thereof in a state in which the first and second plates are bonded to each other.

In the forming of the cooling channels, the cooling channel may have a circular or polygonal cross section shape in a thickness direction of the base substrate in a state in which the first and second plates are bonded to each other.

The cooling channel may include: an introduction part having the cooling material introduced therethrough; a path part connected to the introduction part to thereby allow the introduced cooling material to pass therethrough; and a discharge part connected to the path part to thereby allow the cooling material to be discharged therethrough, and in the forming of the cooling channels, when the path part includes a plurality of paths, the plurality of paths may have a symmetrically radial shape based on the introduction part and the discharge part after the first and second plates are bonded to each other.

The cooling channel may include: an introduction part having the cooling material introduced therethrough; a path part connected to the introduction part to thereby allow the introduced cooling material to pass therethrough; and a discharge part connected to the path part to thereby allow the cooling material to be discharged therethrough, and in the forming of the cooling channels, a width of the path part may be larger than those of the introduction part and the discharge part in a direction in which the cooling material passes after the first and second plates are bonded to each other.

In the forming of the cooling channels, the cooling channel may have a pipe shape having a plurality of bendings after the first and second plates are bonded to each other.

The cooling channel may include: an introduction part having the cooling material introduced therethrough; a path part connected to the introduction part to thereby allow the introduced cooling material to pass therethrough; and a discharge part connected to the path part to thereby allow the cooling material to be discharged therethrough, and wherein in the forming of the cooling channels, when the path part includes a plurality of paths, the plurality of paths may be formed to be in proportion to a heat generation amount of the semiconductor devices, and the plurality of formed paths may be disposed under areas in which the semiconductor devices are mounted.

The method may further include, after the mounting of the semiconductor devices and before the bonding of the first and second plates, forming lead frames on the metal layer; and forming wires for electrical connection between the semiconductor devices and between the semiconductor device and the lead frame.

The method may further include, after the forming of the wires, forming a molding so as to enclose an upper portion of the base substrate and sides thereof.

In the bonding of the first and second plates, the first and second plates may be bonded to each other through any one of an anodic bonding method, an organic adhesion method, and a combination thereof.

DESCRIPTION OF THE PREFERRED EMBODIMENTS

Figure 1:
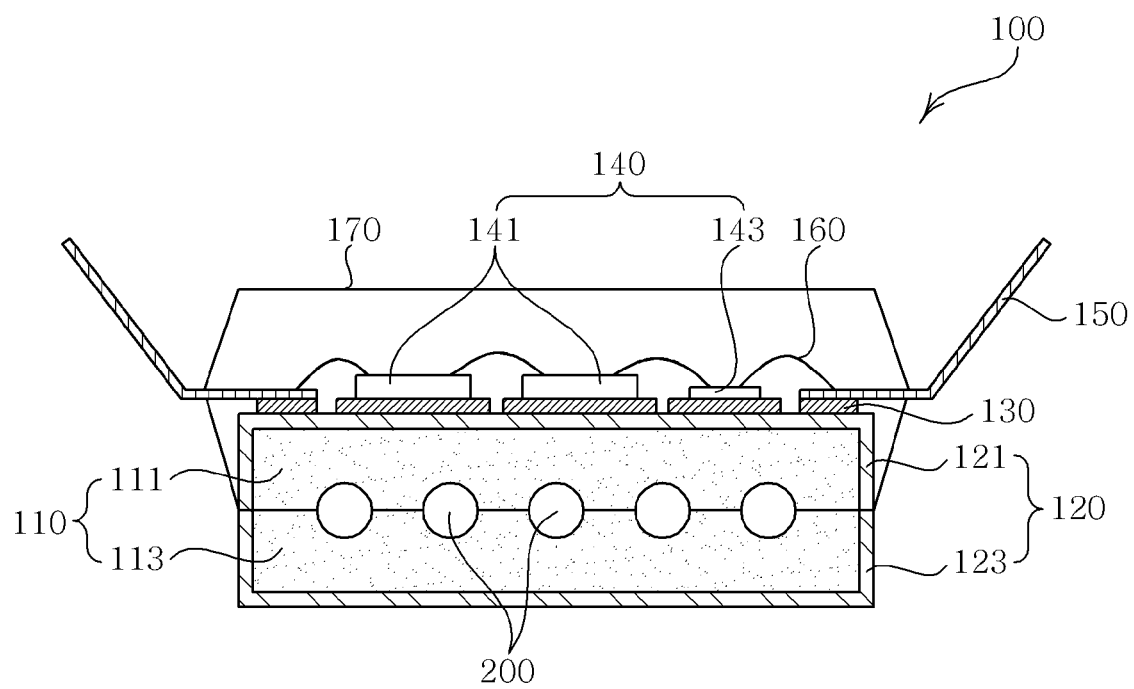
FIG. 1 is a view showing a configuration of a power module package according to a first preferred embodiment of the present invention.

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted. In the description, the terms "first", "second", and so on are used to distinguish one element from another element, and the elements are not defined by the above terms.

Hereinafter, preferred embodiments of the present invention will be described in detail with reference to the accompanying drawings.

Power Module Package

FIG. 1 is a view showing a configuration of a power module package according to a first preferred embodiment of the present invention.

Hereinafter, a configuration of a power module package according to a first preferred embodiment of the present invention shown in FIG. 1 will be described with reference to FIGS. 2 and 3, which show a configuration of a power module package according to other preferred embodiments of the present invention, and FIGS. 4 to 9, which are plan views describing various configurations of a cooling channel according to a preferred embodiment of the present invention.

As shown in FIG. 1, a power module package 100 includes a base substrate 110 made of a metal material, cooling channels 200 formed to allow a cooling material to flow in an inner portion of the base substrate 110, an anodized layer 120 formed on an outer surface of the base substrate 110, a metal layer 130 formed on a first surface of the base substrate 110 having the anodized layer 120 and including circuits and connection pads, and semiconductor devices 140 mounted on the metal layer 130.

In this configuration, the base substrate 110 may be made of aluminum having excellent thermal conductivity but is not limited thereto.

In addition, the anodized layer 120 may be an aluminum oxide insulating layer. Here, the aluminum oxide insulating layer may ensure high heat radiation characteristics and electrical breakdown characteristics of a module due to excellent thermal conductivity (for example, 7 to 20 W/m·K) and high insulation characteristics (for example, 25 V/μm).

In addition, the cooling material may be any material capable of providing heat radiation characteristics of the power module package 100 while moving through the cooling channel 200, such as water, refrigerant, or the like.

As shown in FIG. 1, the cooling channel 200 may be formed at the center of the base substrate 110 in a thickness direction thereof but is not limited thereto. Here, the 'center' indicates a position in the inner portion of the base substrate 110 spaced from upper and lower portions thereof by the same distance.

Figure 2:
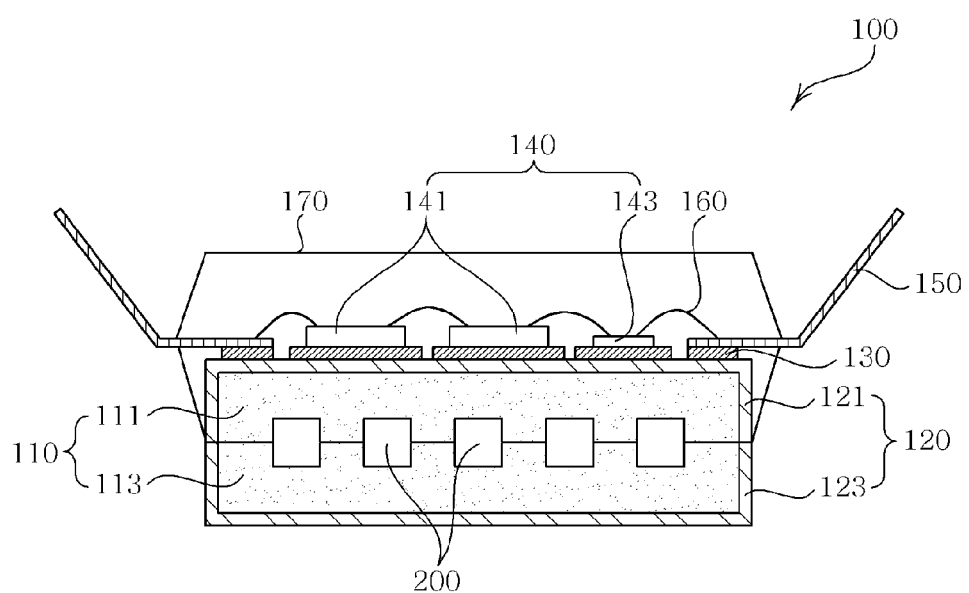
FIG. 2 is a view showing a configuration of a power module package according to a second preferred embodiment of the present invention.
Figure 3:
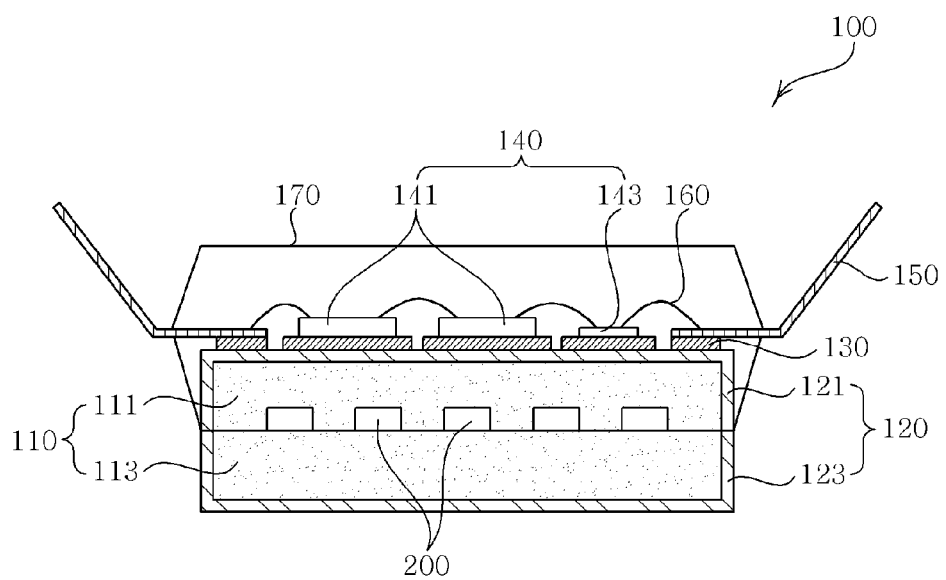
FIG. 3 is a view showing a configuration of a power module package according to a third preferred embodiment of the present invention.

As shown in FIGS. 1 to 3 according to the first to third preferred embodiments of the present invention, the cooling channel 200 may have a circular or polygonal cross section shape in the thickness direction of the base substrate 110.

Figure 4:
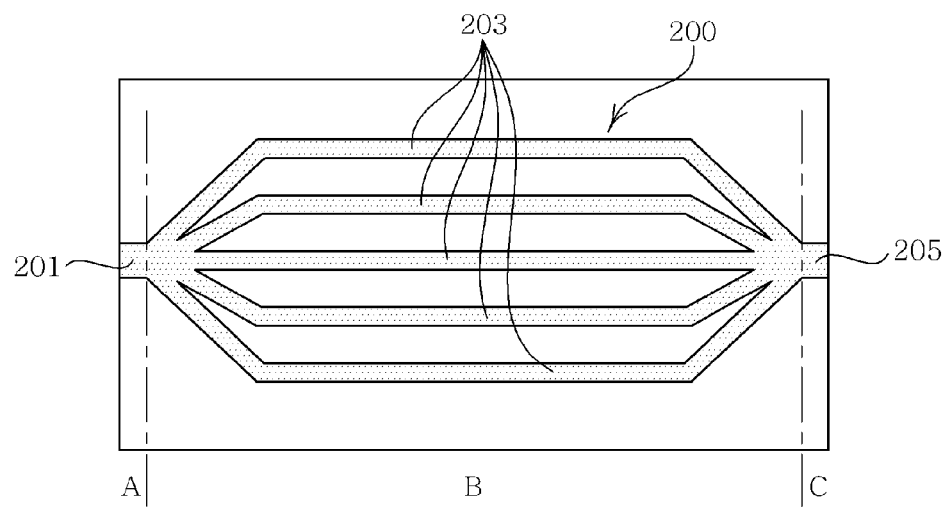
FIGS. 4 to 9 are plan views describing various configurations of a cooling channel according to a preferred embodiment of the present invention.
Figure 5:
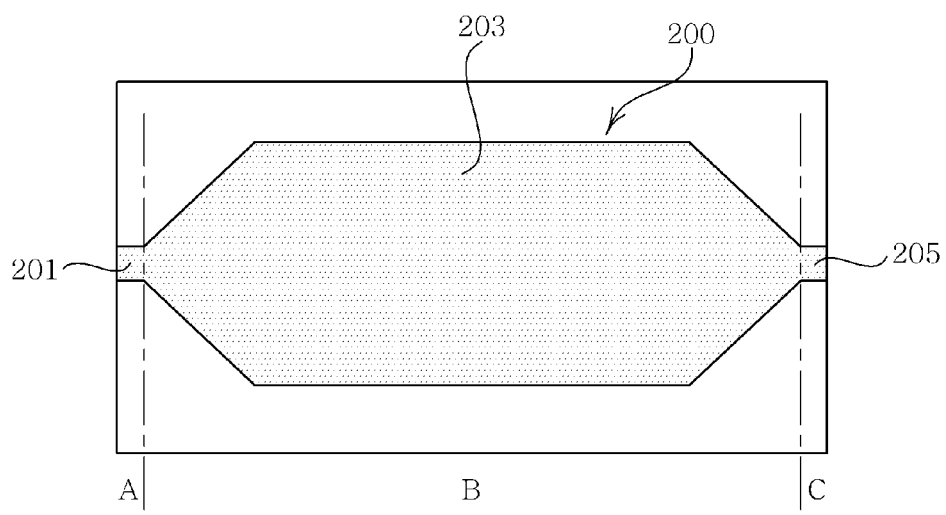
Figure 6:
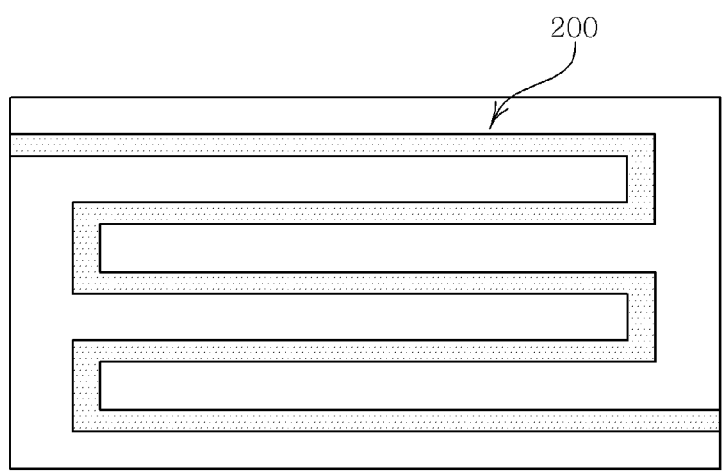

Meanwhile, as shown in FIGS. 4 to 6, the cooling channel 200 includes an introduction part 201 having the cooling material introduced therethrough, a path part 203 connected to the introduction part 201 to thereby allow the introduced cooling material to pass therethrough, and a discharge part 205 connected to the path part 203 to thereby allow the cooling material to be discharged therethrough.

As shown in FIG. 4, when the path part 203 of the cooling channel 200 includes a plurality of paths, the plurality of paths may have a symmetrically radial shape based on the introduction part 201 and the discharge part 205.

For example, the plurality of paths are formed to have a radial shape based on the introduction part 201 and the discharge part 205 in a state in which each of both sides of the plurality of paths formed in an area B of FIG. 4 is connected to the introduction part 201 and the discharge part 205.

In addition, as shown in FIG. 5, a width of the path part 203 in an area B may be larger than those of the introduction part 201 and the discharge part 205 in a direction in which the cooling material passes.

In addition, as shown in FIG. 6, the cooling channel 200 may have a pipe shape having a plurality of bendings.

Meanwhile, when the path part 203 includes a plurality of paths, the plurality of paths may be formed to be in proportion to a heat generation amount of the semiconductor devices 140, and the plurality of formed paths may be disposed under areas in which the semiconductor devices 140 are mounted.

Figure 7:
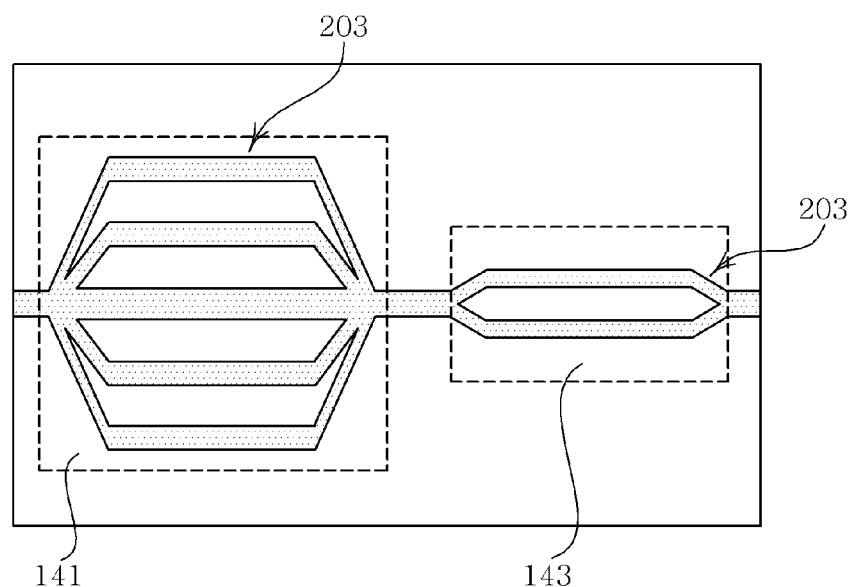

For example, as shown in FIG. 7, a plurality of paths of the path part 203 are formed under the areas in which the semiconductor devices 140 expected to generate heat are mounted, wherein the number of paths to be formed under power devices 141 generating high heat among the semiconductor devices 140 is larger than that of paths to be formed under control devices 143 generating lower heat as compared to the power devices 141.

Therefore, heat radiation characteristics of the semiconductor devices 140 having a high heat generation amount are improved. In addition, heat from the power devices 141 generating relatively high heat is also smoothly transferred, thereby making it possible to further improve the heat radiation characteristics.

Further, more numbers of paths are formed with respect to the power device 141 generating high heat, thereby making it possible to minimize an influence of the heat generated from the power device 141 on the control device 143.

For example, the power device 141 may include an insulated gate bipolar transistor (IGBT), a diode, or the like, and the control device 143 may include a control integrated circuit (IC), or the like.

In addition, the path part 203 may also be formed to have a width that is in proportion to a heat generation amount of the semiconductor device 140.

Figure 8:
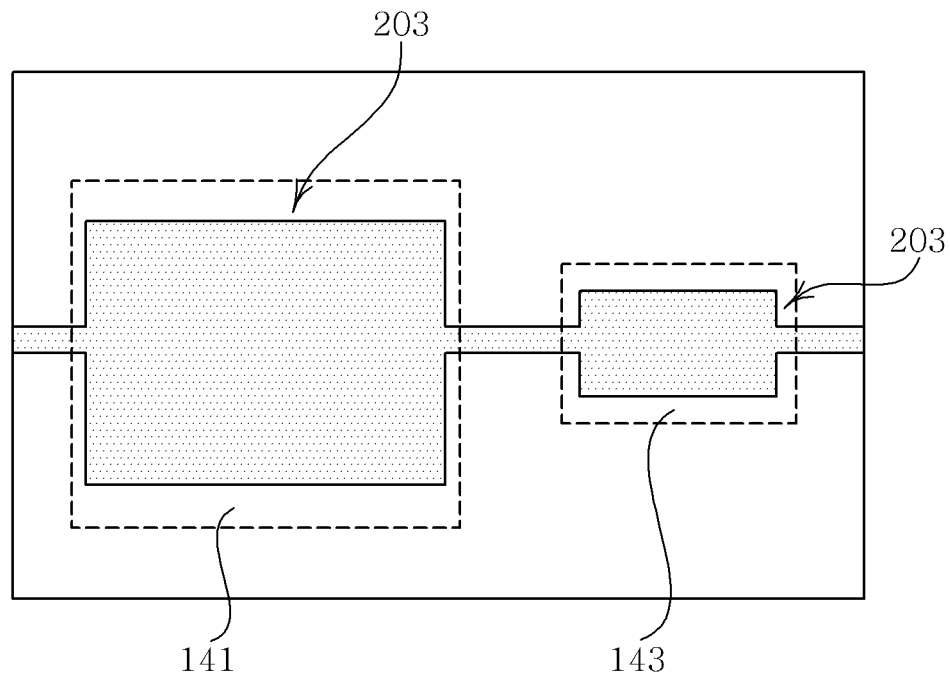

For example, as shown in FIG. 8, the path part 203 in an area in which the semiconductor device 140 is mounted is formed to have a width wider than that of the path part 203 in other areas (for example, an area in which the semiconductor device is not mounted), and the path part 203 formed in an area in which the power device 141 expected to generate high heat is mounted is formed to have a width wider than that of the path part 203 formed in an area in which the control device 143 expected to generate lower heat as compared to the power device 141 is mounted.

Figure 9:
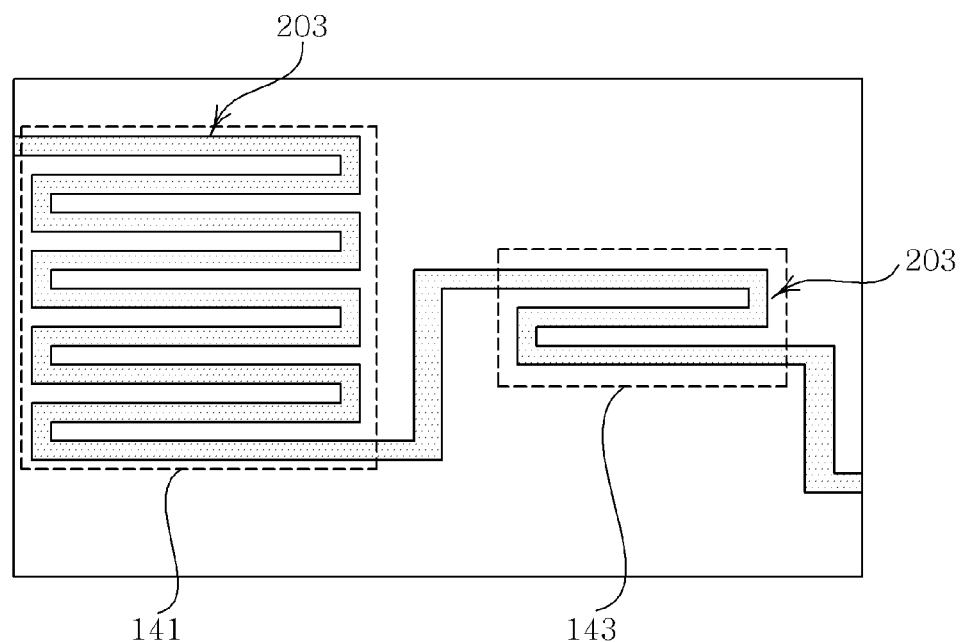
Figure 10:
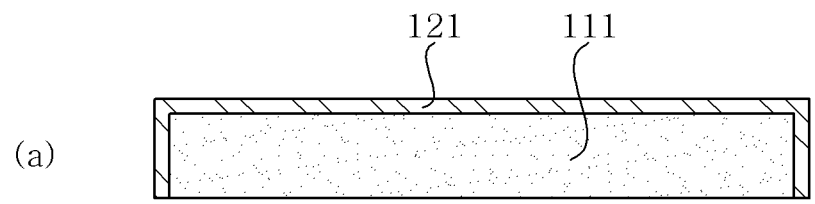
FIGS. 10 to 16 are process flow charts describing a method for manufacturing a power module package according to a first preferred embodiment of the present invention.
Figure 10:
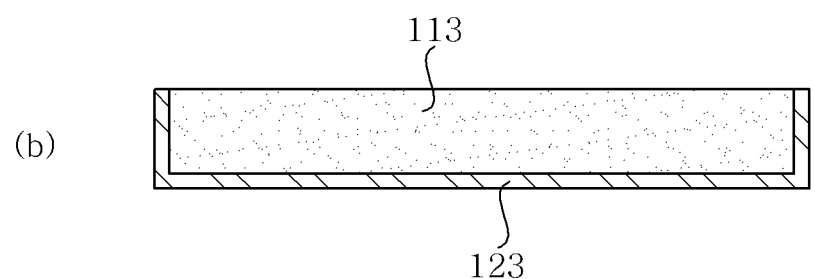
Figure 11:
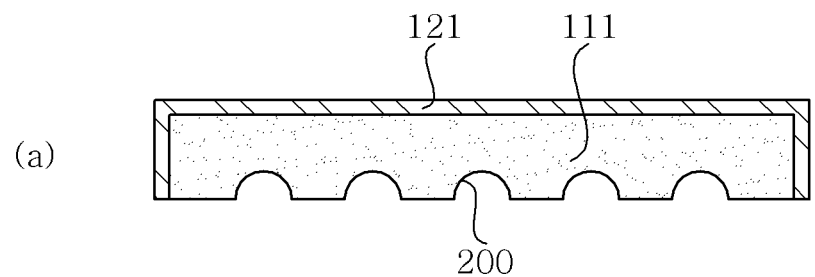
Figure 11:
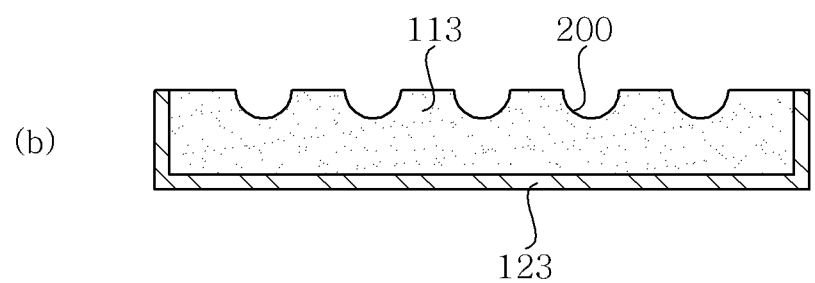

In addition, the cooling channel 200 may also be formed so that the path part 203 is concentratedly disposed according to a heat generation amount of the semiconductor device, as shown in FIG. 9.

For example, the cooling channel 200 as shown in FIG. 6 may be formed so that a plurality of path parts 203 may be formed under the power device 141 and the control device 143 according to the heat generation amount of the semiconductor device and the path part 203 may be more concentratedly disposed under the power device 141 expected to generate the higher heat as compared to the control device 143.

The cooling channel 200 of FIGS. 8 and 9 described above may minimize an influence of the heat generated from the power device 141 on the control device 143.

In addition, the power module package 100 may further include lead frames 150 formed on the metal layer 130 and wires 160 for electrical connection between the semiconductor devices 140 and between the semiconductor device 140 and the lead frame 150.

In addition, the power module package 100 may further include a molding 170 formed to enclose an upper portion of the base substrate 110 and sides thereof.

Here, the molding 170 is formed in a form in which a lower surface of the base substrate 110 is exposed for heat radiation efficiency characteristics.

Method for Manufacturing Power Module Package

FIGS. 10 to 16 are process flow charts describing a method for manufacturing a power module package according to a first preferred embodiment of the present invention. Hereinafter, a method for manufacturing a power module package according to a first preferred embodiment of the present invention shown in FIGS. 10 to 16 will be described with reference to FIGS. 4 to 9.

First, as shown in FIGS. 10A and 10B, first and second plates 111 and 113 made of a metal material are prepared.

Then, anodized layers 121 and 123 are formed on surfaces except for one surfaces of the first and second plates 111 and 113.

For example, as shown in FIGS. 10A and 10B, the anodized layers 121 and 123 are formed on three surfaces except for surfaces at which the first and second plates 111 and 113 are bonded to each other.

In addition, as the anodized layers 121 and 123, an $Al_2O_3$ oxide film may be formed to have a thickness of 20 to 500 μm through an anodizing method according to the use thereof.

Next, as shown in FIGS. 11A and 11B, groove shaped cooling channels 200 are formed inwardly from one surface of both or one of the first and second plates 111 and 113.

Here, the cooling channels 200 may be formed through chemical and electrochemical etching, mechanical processing (routing, V-Cut) or the like.

In addition, when the cooling channels 200 are formed in the first and second plates 111 and 113, the cooling channels 200 formed in the first and second plates 111 and 113 need to have a form of a single cooling channel 200 after the first and second plates 111 and 113 are bonded to each other. Therefore, the cooling channels 200 are formed in areas in which the first and second plates 111 and 113 correspond to each other.

When the cooling channels 200 are formed in only any one of the first and second plates 111 and 113, the above-mentioned content may not be considered.

In addition, the cooling channel 200 may be formed at the center of the base substrate 110 in a thickness direction thereof in a state in which the first and second plates 111 and 113 are bonded to each other.

In addition, the cooling channel 200 may be formed to have a circular or polygonal cross section shape in the thickness direction of the base substrate 110 in a state in which the first and second plates 111 and 113 are bonded to each other.

Figure 12:
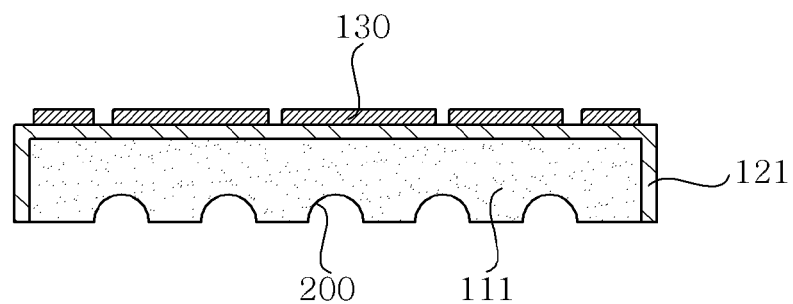

Next, as shown in FIG. 12, a metal layer 130 including circuits and connection pads is formed on the anodized layer 121 on the other surface of the first plate 111.

Here, in the metal layer 130, a metal seed layer is formed through a dry sputtering method or a wet electroless and electro plating method, and the connection pads and the circuits are then formed through a wet chemical plating method and an electro plating or lift-off method.

The metal layer may be made of any one material selected from a group consisting of Cu, Cu/Ni, Cu/Ti, Au/Pt/Ni/Cu, Au/Pt/Ni/Cu/Ti, and a combination thereof. Here, "/" indicates 'and'.

Figure 13:
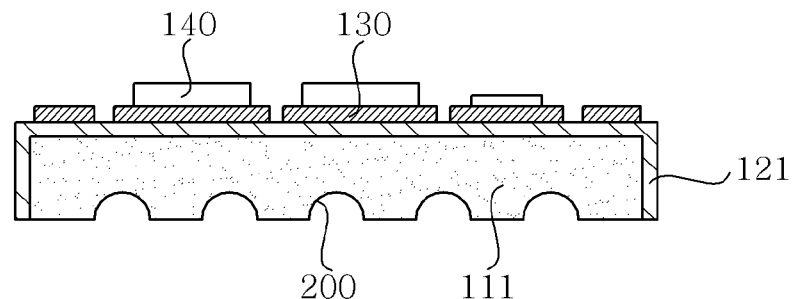

Thereafter, as shown in FIG. 13, semiconductor devices 140 are mounted on the metal layer 130.

As a bonding agent for mounting the semiconductor device 140 on the metal layer 130, a solder, an organic resin, or the like, may be used.

Figure 14:
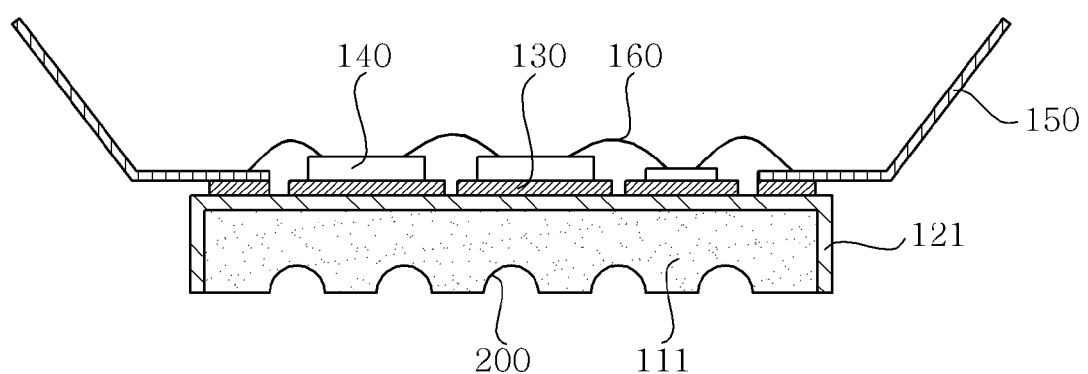

Then, as shown in FIG. 14, lead frames 150 are formed on the metal layer 130.

Here, the lead frames 150 are formed on portions of the metal layer 130 on which the semiconductor devices 140 are not mounted.

As a bonding agent for mounting the lead frame 150 on the metal layer 130, a solder, an organic resin, or the like, may be used.

Next, as shown in FIG. 14, wires 160 for electrical connection between the semiconductor devices 140 and between the semiconductor device 140 and the lead frame 150 are formed.

Figure 15:
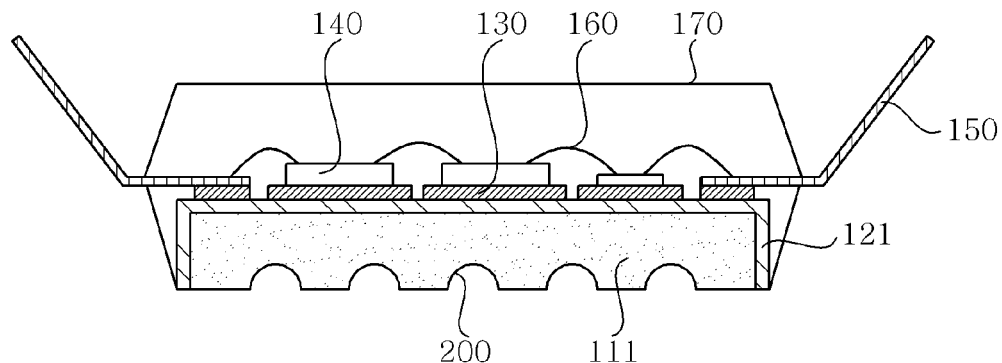

Thereafter, as shown in FIG. 15, a molding is formed to enclose an upper portion of the base substrate 110 and sides thereof.

More specifically, the molding is formed in a form in which it covers all of the metal layer 130, the semiconductor devices 140, and the wires 160, which are disposed on an upper portion of the first plate 111, and the sides of the first plate 111, and also covers one sides of the lead frames 150.

Meanwhile, the molding 170 may be formed on sides of the second plate 113 as well as the sides of the first plate 111. In this case, an operation of bonding the first and second plates 111 and 113 to each other is first performed before the molding 170 is formed.

That is, a shape of the molding 170 may be changed as needed.

A lower surface of the base substrate 110 in a state in which the first and second plates 111 and 113 are bonded to each other is not covered by the molding but is exposed. This is to smoothly radiate the heat generated from the semiconductor device 140 to the outside.

Figure 16:
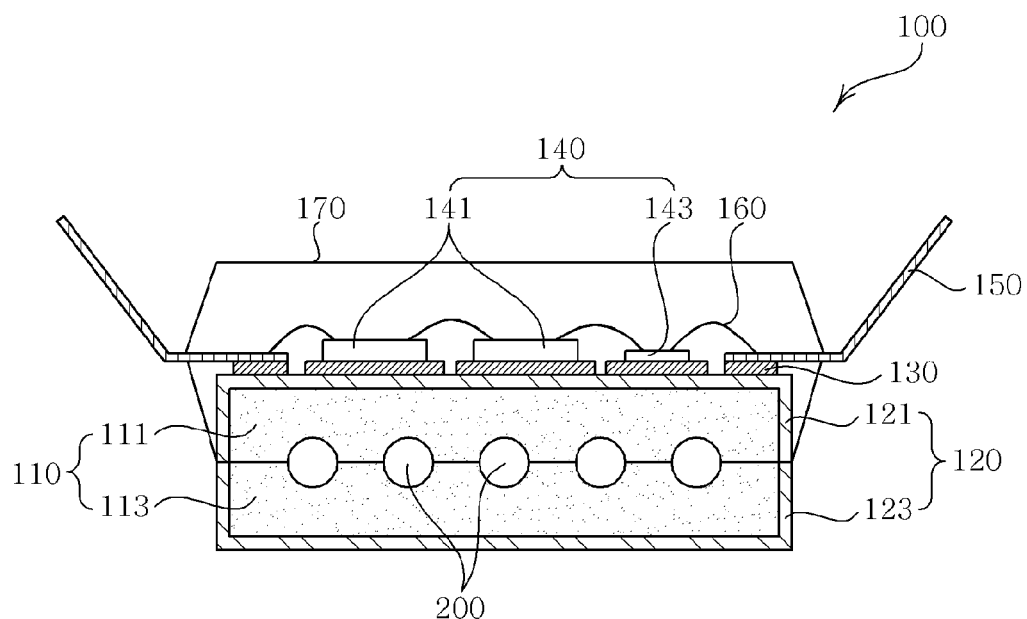

Then, as shown in FIG. 16, the first and second plates 111 and 113 are bonded to each other.

Here, the first and second plates 111 and 113 are bonded to each other through any one of an anodic bonding method, an organic adhesion method, and a combination thereof.

Meanwhile, the cooling channel 200 includes an introduction part 201 having a cooling material introduced therethrough, a path part 203 connected to the introduction part 201 to thereby allow the introduced cooling material to pass therethrough, and a discharge part 205 connected to the path part 203 to thereby allow the cooling material to be discharged therethrough.

As shown in FIG. 4, when the path part 203 of the cooling channel 200 includes a plurality of paths, the plurality of paths may have a symmetrically radial shape based on the introduction part 201 and the discharge part 205.

For example, the plurality of paths are formed to have a radial shape based on the introduction part 201 and the discharge part 205 in a state in which each of both sides of the plurality of paths formed in an area B of FIG. 4 is connected to the introduction part 201 and the discharge part 205.

In addition, as shown in FIG. 5, a width of the path part 203 in an area B may be larger than those of the introduction part 201 and the discharge part 205 in a direction in which the cooling material passes.

In addition, as shown in FIG. 6, the cooling channel 200 may have a pipe shape having a plurality of bendings.

Meanwhile, when the path part 203 includes a plurality of paths, the plurality of paths may be formed to be in proportion to a heat generation amount of the semiconductor devices 140, and the plurality of formed paths may be disposed under areas in which the semiconductor devices 140 are mounted.

For example, as shown in FIG. 7, a plurality of paths of the path part 203 are formed under the areas in which the semiconductor devices 140 expected to generate heat are mounted, wherein the number of paths to be formed under power devices 141 generating high heat among the semiconductor devices 140 is larger than that of paths to be formed under control devices 143 generating lower heat as compared to the power devices 141.

Therefore, heat radiation characteristics of the semiconductor devices 140 having a high heat generation amount are improved. In addition, heat from the power devices 141 generating relatively high heat is also smoothly transferred, thereby making it possible to further improve the heat radiation characteristics.

As set forth above, with the power module package and the method for manufacturing the same according to the preferred embodiments of the present invention, the cooling channels are formed in the base substrate made of the metal material and including the anodized layer having the semiconductor device mounted thereon and having excellent heat radiation characteristics to form the power module and the heat sink integrally with each other, thereby making it possible to simultaneously obtain a heat radiation effect by the base substrate and a heat radiation effect by the cooling channel. Therefore, the heat generated from the semiconductor device is more effectively transferred to improve the heat radiation characteristics, thereby making it possible to increase reliability of a product.

In addition, according to the preferred embodiments of the present invention, the base substrate and the heat sink are formed integrally with each other, thereby making it possible to reduce a size of the power module package and a manufacturing cost thereof.

Furthermore, according to the preferred embodiments of the present invention, since a design of the cooling channel may be freely implemented, the paths of the cooling channel are concentratedly disposed or are adjusted in view of an area according to the characteristics and the use of the semiconductor device mounted on the power module package, thereby making it possible to effectively radiate the heat from the semiconductor device generating high heat.

Although the preferred embodiments of the present invention have been disclosed for illustrative purposes, they are for specifically explaining the present invention and thus a power module package and a method for manufacturing the same according to the present invention are not limited thereto, but those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A power module package comprising:
   a base substrate made of a metal material;
   cooling channels formed to allow a cooling material to flow in an inner portion of the base substrate;
   an anodized layer formed on an outer surface of the base substrate;

a metal layer formed on a first surface of the base substrate having the anodized layer and including circuits and connection pads; and semiconductor devices mounted on the metal layer, wherein the cooling channel includes:

an introduction part having the cooling material introduced therethrough;

a path part connected to the introduction part to thereby allow the introduced cooling material to pass therethrough; and a discharge part connected to the path part to thereby allow the cooling material to be discharged therethrough, wherein when the path part includes a plurality of paths, the plurality of paths are formed to be in proportion to a heat generation amount of the semiconductor devices, and the plurality of formed paths are disposed under areas in which the semiconductor devices are mounted.

2. The power module package as set forth in claim 1, wherein the cooling channel is formed at the center of the base substrate in a thickness direction thereof.

3. The power module package as set forth in claim 1, wherein the cooling channel has a circular or polygonal cross section shape in a thickness direction of the base substrate.

4. The power module package as set forth in claim 1, further comprising lead frames formed on the metal layer; and wires for electrical connection between the semiconductor devices and between the semiconductor device and the lead frame.

5. The power module package as set forth in claim 1, further comprising a molding formed to enclose an upper portion of the base substrate and sides thereof.

6. The power module package as set forth in claim 1, wherein the base substrate is made of aluminum.

* * * * *